US010032599B2

(12) United States Patent
Kieft

(10) Patent No.: US 10,032,599 B2
(45) Date of Patent: Jul. 24, 2018

(54) TIME-RESOLVED CHARGED PARTICLE MICROSCOPY

(71) Applicant: FEI Company, Hillsboro, OR (US)

(72) Inventor: Erik René Kieft, Eindhoven (NL)

(73) Assignee: FEI Cmnpany, Hillsboro, OR (US)

( * ) Notice: Subject to any disclaimer, the term of this patent is extended or adjusted under 35 U.S.C. 154(b) by 0 days.

(21) Appl. No.: 15/364,163

(22) Filed: Nov. 29, 2016

(65) Prior Publication Data

US 2018/0151326 A1    May 31, 2018

(30) Foreign Application Priority Data

Nov. 28, 2016 (EP) ..................... 16200898

(51) Int. Cl.
*H01J 37/28* (2006.01)
*H01J 37/26* (2006.01)
(Continued)

(52) U.S. Cl.
CPC .......... *H01J 37/045* (2013.01); *H01J 37/147* (2013.01); *H01J 37/226* (2013.01); *H01J 37/244* (2013.01);
(Continued)

(58) Field of Classification Search
CPC .......... H01J 37/28; H01J 37/26; H01J 37/045; H01J 37/22; H01J 37/265; H01J 37/073; H01J 37/1472; H01J 37/1477; H01J 37/228; H01J 37/244; H01J 37/065; H01J 37/075; H01J 37/10; H01J 37/147; H01J 37/1474;
(Continued)

(56) References Cited

U.S. PATENT DOCUMENTS 5,345,080 A * 9/1994 Yajima ................ H01J 37/26
250/311
6,218,664 B1 4/2001 Krans et al.
(Continued)

FOREIGN PATENT DOCUMENTS

WO     2013119612 A1    8/2013

OTHER PUBLICATIONS

"Electron Microscope", Wikipedia, Retrieved from the Internet Oct. 15, 2015, http://en.wikipedia.org/wiki/Electron_microscope, 11 pages.
(Continued)

*Primary Examiner* — David A Vanore
(74) *Attorney, Agent, or Firm* — Scheinberg & Associates, P.C.; Michael O. Scheinberg

(57) ABSTRACT

A method of investigating a specimen using charged particle microscopy, comprising the following steps:
  Using a primary source to produce a pulsed beam of charged particles that propagate along a beam path;
  Providing a specimen at an irradiation position in said beam path;
  Using a secondary source to produce repetitive excitations of the specimen;
  Using a detector to register charged particles in said beam that traverse the specimen after each said excitation,
wherein:
  Said primary source is configured to produce a train of multiple pulses per excitation by said secondary source;
  Said detector is configured to comprise an integrated array of pixels, each with an individual readout circuit, to register a time-of-arrival of individual particles in said train.

18 Claims, 1 Drawing Sheet

(51) Int. Cl.
*H01J 37/04* (2006.01)
*H01J 37/244* (2006.01)
*H01J 37/147* (2006.01)
*H01J 37/22* (2006.01)

(52) U.S. Cl.
CPC . *H01J 2237/0432* (2013.01); *H01J 2237/152* (2013.01)

(58) Field of Classification Search
CPC .......... H01J 37/21; H01J 37/24; H01J 37/243; H01J 37/285; H01J 37/302; H01J 37/3026; H01J 37/304; H01J 37/3056; H01J 3/26; B82Y 30/00; B82Y 40/00; G01B 11/2441; G01B 9/02004; G01B 9/02014; G01B 9/02028; G01B 9/02044; G01B 9/02091; G01B 9/04; G01N 21/00; G01N 21/636; G01N 23/04; G01N 23/20058; G01N 23/20083; G01N 23/2055
USPC ......... 250/307, 311, 310, 396 R, 397, 492.1, 250/492.2, 492.22, 398, 440.11, 492.3; 348/370
See application file for complete search history.

(56) References Cited

U.S. PATENT DOCUMENTS

| | | | |
|---|---|---|---|
| 7,569,841 B2 * | 8/2009 | Hill ..................... | H01J 37/1474 250/397 |
| 8,101,928 B2 | 1/2012 | Hill et al. | |
| 8,314,409 B2 * | 11/2012 | Miller ................. | H01J 37/1472 250/307 |
| 2005/0006582 A1 | 1/2005 | Steigerwald et al. | |
| 2005/0253069 A1 * | 11/2005 | Zewail .................. | H01J 37/065 250/311 |
| 2008/0216926 A1 * | 9/2008 | Guo .................. | B23K 26/0084 148/565 |
| 2008/0299408 A1 * | 12/2008 | Guo .................. | B23K 26/0084 428/573 |
| 2009/0066963 A1 * | 3/2009 | Petek ...................... | G01B 9/04 356/450 |
| 2010/0141829 A1 * | 6/2010 | Jalali .................. | A61B 1/00009 348/370 |
| 2011/0220792 A1 * | 9/2011 | Zewail .................. | H01J 37/244 250/307 |
| 2011/0284744 A1 * | 11/2011 | Zewail .................. | H01J 37/228 250/307 |
| 2012/0261586 A1 * | 10/2012 | Knippels .............. | H01J 37/045 250/396 R |
| 2014/0103225 A1 * | 4/2014 | Kieft ...................... | H01J 37/28 250/440.11 |
| 2015/0235800 A1 * | 8/2015 | Reed ..................... | H01J 37/265 250/307 |
| 2015/0332888 A1 * | 11/2015 | Reed ..................... | H01J 37/073 250/307 |
| 2016/0005566 A1 * | 1/2016 | Zewail .................... | H01J 37/26 250/307 |
| 2016/0293377 A1 | 10/2016 | Baryshev et al. | |
| 2017/0243713 A1 | 8/2017 | Kieft et al. | |

OTHER PUBLICATIONS

"Focused Ion Beam", Wikipedia, Retrieved from the Internet Jul. 11, 2016, https://en.wikipedia.org/wiki/Focused_ion_beam, 7 pages.
"Medipix", Wikipedia, Retrieved from the Internet Dec. 27, 2016, https://en.wikipedia.org/wiki/Medipix, 6 pages.
"Scanning Electron Microscope", Wikipedia. Retrieved from the Internet Jul. 25, 2016, http://en.wikipedia.org/wiki/Scanning_electron_microscope, 23 pages.
"Scanning Helium Ion Microscope", Wikipedia, Retrieved from the Internet on Jul. 25, 2016, http://en.wikipedia.org/wiki/Scanning_Helium_Ion_Microscope, 2 pages.
"Scanning Transmission Electron Microscopy", Wikipedia, Retrieved from the Internet Jul. 25, 2016, http://en.wikipedia.org/wiki/Scanning_transmission_electron_microscopy, 5 pages.
"Transmission Electron Microscopy", Wikipedia, Retrieved from the Internet Jul. 25, 2016, http://en.wikipedia.org/wiki/Transmission_electron_microscopy, 23 pages.
Cremons, D.R., et al. "Femtosecond electron imaging of defect-modulated phonon dynamics", Nature Communications, Apr. 15, 2016, 8 pages, vol. 7.
Escovitz, W.H. et al., "Scanning Transmission Ion Microscope with a Field Ion Source," Proc. Nat. Acad. Sci. USA, May 1975, pp. 1826-1828, vol. 72, No. 5.
Fehr, J., et al., "A 100-Femtosecond Electron Beam Blanking System," Microelectronic Engineering, 1990, pp. 221-226, vol. 12.
Frojdh, Erik, et al., "TIMEPIX3: First measurements and characterization of a hybrid pixel detector working in event driven mode," Journal of Instrumentation, Jan. 26, 2015, 31 pages, vol. 10, CERN.
Lassise, A., et al., "Compact, low power radio frequency cavity for femtosecond electron microscopy," Review of Scientific Instruments, 2012, 10 pages, vol. 83.
Medipix, "The Timepix Chip," Retrieved from the Internet Apr. 3, 2017, medipix.web.cern.ch/medipix/pages/medipix2/timepix.php, 1 page.
Ura, Katsumi, et al., "Picosecond Pulse Stroboscopic Scanning Electron Microscope", 1978, pp. 247-252, vol. 27, No. 4.
Varentsov, D. et al. "First biological images with high-energy proton microscopy", Physica Medica (2013), pp. 208-213, vol. 29.
Visser, Jan, "Developments for future tracking systems based on Medipix read-out chips," Jun. 17, 2015, indico.cern.ch/event/363327/contributions/860768/attachments/722760/992018/Jan_Visser_Medipix, 37 pages.
Beacham, R. et al., "Medipix2/Timepix detector for time resolved Transmission Electron Microscopy," Journal of Instrumentation, Institute of Physics Publishing, Dec. 20, 2011, vol. 6 No. 12, 5 pages.
Lassise, Adam C., "Miniaturized RF Technology for Femtosecond Electron Microscopy," thesis and work carried out at the group Coherence and Quantum Technology (CQT) at the Eindhoven University of Technology (TUE) Department of Applied Physics, Nov. 1, 2012, ISBN: 978-90-386-3272-8, 132 pages.
Qiu, J. et al., "GHz laser-free time-resolved transmission electron microscopy: A stroboscopic high-duty-cycle method," Ultramicroscopy, Feb. 1, 2016, vol. 151, pp. 130-136.

* cited by examiner

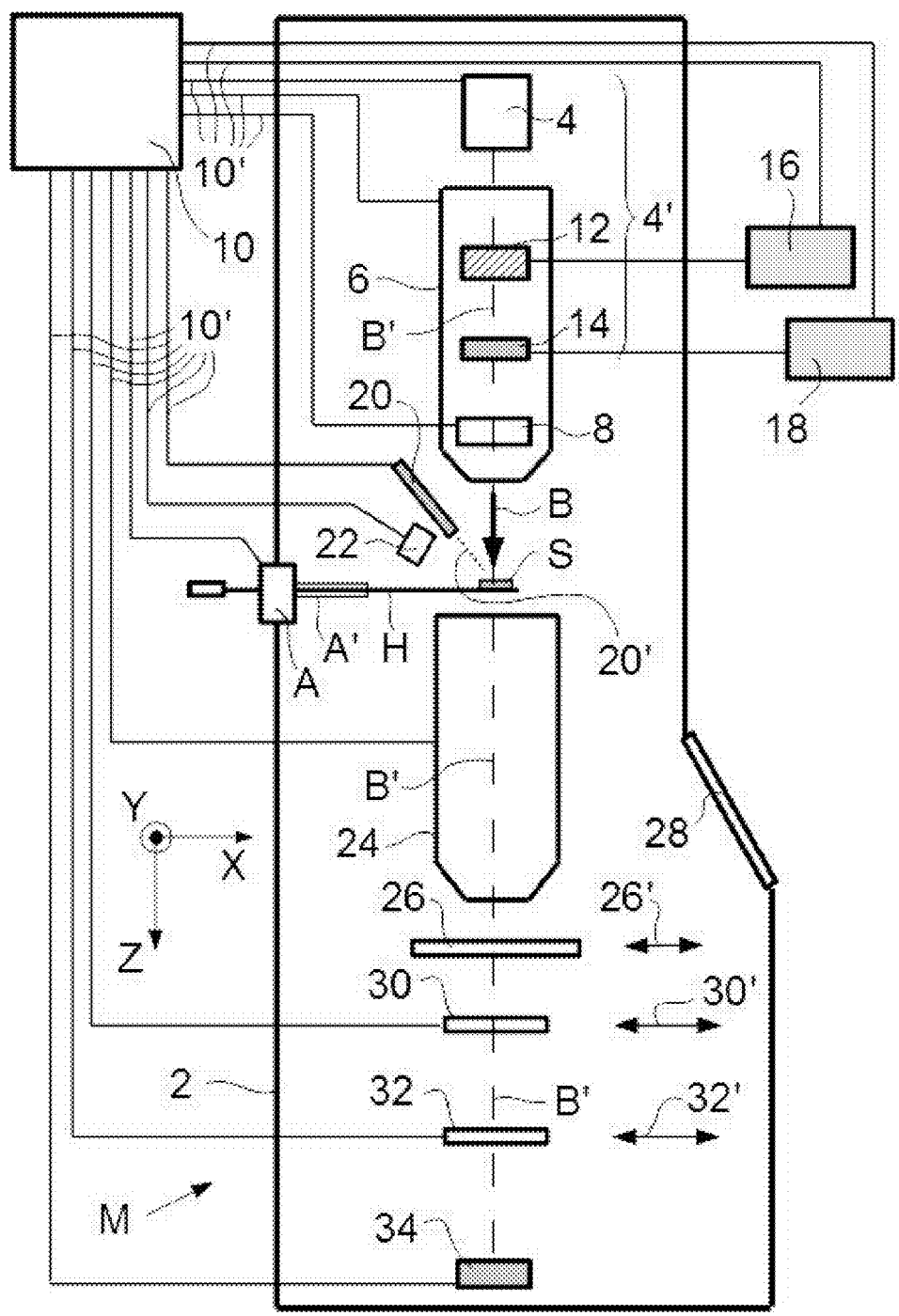

TIME-RESOLVED CHARGED PARTICLE MICROSCOPY

The invention relates to a method of investigating a specimen using charged particle microscopy, comprising the following steps:
- Using a primary source to produce a pulsed beam of charged particles that propagate along a beam path;
- Providing a specimen at an irradiation position in said beam path;
- Using a secondary source to produce repetitive excitations of the specimen;
- Using a detector to register charged particles in said beam that traverse the specimen after each said excitation The invention also relates to a charged particle microscope in which such a method can be enacted.

Charged particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" tools (e.g. a FIB-SEM), which additionally employ a "machining" Focused Ion Beam (FIB), allowing supportive activities such as ion-beam milling or Ion-Beam-Induced Deposition (IBID), for example. More specifically:
- In a SEM, irradiation of a specimen by a scanning electron beam precipitates emanation of "auxiliary" radiation from the specimen, in the form of secondary electrons, backscattered electrons, X-rays and cathodoluminescence (infrared, visible and/or ultraviolet photons), for example; one or more components of this emanating radiation is/are then detected and used for image accumulation purposes.
- In a TEM, the electron beam used to irradiate the specimen is chosen to be of a high-enough energy to penetrate the specimen (which, to this end, will generally be thinner than in the case of a SEM specimen); the transmitted electrons emanating from the specimen can then be used to create an image. When such a TEM is operated in scanning mode (thus becoming a STEM), the image in question will be accumulated during a scanning motion of the irradiating electron beam.

More information on some of the topics elucidated here can, for example, be gleaned from the following Wikipedia links:
- en.wikipedia.org/wiki/Electron_microscope
- en.wikipedia.org/wiki/Scanning_electron_microscope
- en.wikipedia.org/wiki/Transmission_electron_microscopy
- en.wikipedia.org/wiki/Scanning_transmission_electron_microscopy As an alternative to the use of electrons as irradiating beam, charged particle microscopy can also be performed using other species of charged particle. In this respect, the phrase "charged particle" should be broadly interpreted as encompassing electrons, positive ions (e.g. Ga or He ions), negative ions, protons and positrons, for instance. As regards non-electron-based charged particle microscopy, some further information can, for example, be gleaned from references such as the following:
- en.wikipedia.org/wiki/Focused_ion_beam
- en.wikipedia.org/wiki/Scanning_Helium_Ion_Microscope
- W. H. Escovitz, T. R. Fox and R. Levi-Setti, *Scanning Transmission Ion Microscope with a Field Ion Source*, Proc. Nat. Acad. Sci. USA 72(5), pp 1826-1828 (1975). www.ncbi.nlm.nih.gov/pubmed/22472444

It should be noted that, in addition to imaging and performing (localized) surface modification (e.g. milling, etching, deposition, etc.), a charged particle microscope may also have other functionalities, such as performing spectroscopy, examining diffractograms, etc.

In all cases, a Charged Particle Microscope (CPM) will comprise at least the following components:
- A radiation source, such as a Schottky electron source or ion gun.
- An illuminator, which serves to manipulate a "raw" radiation beam from the source and perform upon it certain operations such as focusing, aberration mitigation, cropping (with an aperture), filtering, etc. It will generally comprise one or more (charged-particle) lenses, and may comprise other types of (particle-) optical component also. If desired, the illuminator can be provided with a deflector system that can be invoked to cause its exit beam to perform a scanning motion across the specimen being investigated.
- A specimen holder, on which a specimen under investigation can be held and positioned (e.g. tilted, rotated). If desired, this holder can be moved so as to effect scanning motion of the beam w.r.t. the specimen. In general, such a specimen holder will be connected to a positioning system such as a mechanical stage.
- A detector (for detecting radiation emanating from an irradiated specimen), which may be unitary or compound/distributed in nature, and which can take many different forms, depending on the radiation being detected. Examples include photodiodes, CMOS detectors, CCD detectors, photovoltaic cells, X-ray detectors (such as Silicon Drift Detectors and Si(Li) detectors), etc. In general, a CPM may comprise several different types of detector, selections of which can be invoked in different situations.

In the case of a transmission-type microscope (such as a (S)TEM, for example), the CPM will also comprise:
- An imaging system, which essentially takes charged particles that are transmitted through a specimen (plane) and directs (focuses) them onto analysis apparatus, such as a detection/imaging device, spectroscopic apparatus (such as an EELS device; EELS=Electron Energy-Loss Spectroscopy), etc. As with the illuminator referred to above, the imaging system may also perform other functions, such as aberration mitigation, cropping, filtering, etc., and it will generally comprise one or more charged-particle lenses and/or other types of particle-optical components.

In what follows, the invention may—by way of example—sometimes be set forth in the specific context of electron microscopy; however, such simplification is intended solely for clarity/illustrative purposes, and should not be interpreted as limiting.

A particular example of a method as set forth in the opening paragraph above is so-called laser pump-pulse microscopy, in which laser pulses are used to trigger a repeatable/reproducible temporal process in the specimen under study. Examples of temporal processes in this context include phase transitions, plasmonic excitations, mechanical vibrations, ablative processes, heat flow, chemical reactions, etc. For a specific description of a specimen investigation of this type, see, for example, the journal article by D. R.

Cremons et al., *Femtosecond electron imaging of defect-modulated phonon dynamics*, Nature Communications 7, article #11230 (2016):
www.nature.com/articles/ncomms11230

Although prior-art time-resolved charged particle microscopy techniques have produced agreeable results up to now, the current inventors have worked extensively to provide an innovative alternative to conventional approaches. The results of this endeavor are the subject of the current invention.

It is an object of the invention to provide an innovative improvement of a method as set forth in the opening paragraph above. More specifically, it is an object of the invention that this technique should allow specimen investigation with a greatly improved temporal resolution as compared to prior-art approaches. Moreover, it is an object of the invention that this new method should be more versatile than existing techniques in this area.

These and other objects are achieved in a method as set forth in the opening paragraph above, characterized in that:
  Said primary source is configured to produce a train of multiple pulses per excitation by said secondary source;
  Said detector is configured to comprise an integrated array of pixels, each with an individual readout circuit, to register a time-of-arrival of individual particles in said train.

It should be noted that the employed excitation from said secondary source may, for example, comprise a photon beam (as in the case of a pulsed laser, or a pulsed X-ray source, for instance), a (secondary) charged particle beam (e.g. derived from a (mini) particle accelerator), an electromagnetic field (e.g. produced by an electrode or electromagnet), a mechanical stimulus (e.g. from a piezoelectric actuator), as well as combinations and hybrids hereof.

In essence, the operation of such a set-up exploits inter alia the following insights:
  Many specimens in time-resolved charged particle microscopy can only withstand a certain number of excitations (from said secondary source) before getting damaged, destroyed, or changing their properties to an extent that inhibits further meaningful study; it is therefore important to collect as much signal as possible from every excitation of the specimen. In other instances, only a certain number of excitations per second can be tolerated, e.g. due to the difficulty of transporting introduced heat (arising from said excitations) away from the specimen. On the other hand, the need to achieve good temporal resolution creates a drive toward using very short primary source pulses, but such pulses can contain only a few charged particles each; as a result, several repeat measurements will generally be necessary in order to achieve an acceptable cumulative signal-to-noise ratio. This conflict between temporal resolution and signal per pulse is a nagging dilemma in time-resolved imaging.
  The present invention provides a way of extracting more signal (and, concurrently, better temporal resolution) from each specimen excitation, thereby allowing a reduction in total acquisition time and/or the collection of a greater cumulative signal quantity (longer "movies") as compared to the prior art. This is achieved by:
    Embodying the primary source to produce ultra-short pulses, with a period that is much shorter than the specimen excitation period, thereby producing a train of multiple primary pulses per excitation.
    Embodying the detector to have an ultra-short temporal resolution—that is ideally shorter than the period of the primary source—inter alia by providing each detector pixel with its own individual readout electronics; in such a set-up, the readout delay caused by traditional row/column polling of a pixel array is obviated, so that each impact of a charged particle on the detector can be assigned a highly accurate individual timestamp.

In an advantageous embodiment of the invention, the employed detector comprises a Timepix detection chip. Timepix devices can be regarded as a hybrid of Medipix detection devices—a family of photon counting/particle tracking detectors developed by an international consortium led by CERN (European Center for Nuclear Research). More specifically, Timepix devices add advanced Time-over-Threshold/Time-of-Arrival functionalities to the basic Medipix concept—making them ideal for use as a detector in the present invention. These detectors are commercially available, e.g. from companies such as Amsterdam Scientific Instruments (The Netherlands) and Advacam (Czech Republic). The current fastest Timepix devices (Timepix 3) have a temporal resolution of 1.56 ns, making them compatible with a primary pulse frequency of ~0.6 GHz. A follow-up generation of devices (Timepix 4) has a specified temporal resolution of a few hundred picoseconds, making them compatible with a primary pulse frequency at (or approaching) ~3 GHz (the standard European s-band frequency=2.998 GHz). Further information on Timepix devices can, for example, be gleaned from the following sources:
  medipix.web.cern.ch/medipix/pages/medipix2/timepix.php
  en.wikipedia.org/wiki/Medipix
  ardent.web.cern.ch/ardent/dl/dissemination/erikfrojdh_timepix3_v2.pdf
  indico.cern.ch/event/363327/contributions/860768/attachments/722760/992018/Jan_Visser_Medipix.pdf In an embodiment of the invention, the primary source comprises an oscillatory electromagnetic beam deflector, which is used to chop a beam from a continuous source (such as a Schottky gun or liquid metal ion source, for example). An example of such a deflector is an electrostatic/capacitive deflector, which is used to periodically deflect a beam of charged particles laterally from/to a nominal propagation axis: such a deflector can achieve pulse lengths less than 1 ns, and is a relatively straightforward chopping solution for relatively low beam energies (as typically encountered in a SEM, for example), but will require larger driving voltages for higher beam energies (as typically encountered in a TEM, for example). Inter alia in this latter case, a more efficient choice of beam chopper may be an RF (Radio Frequency) cavity beam chopper, more particularly a $TM_{110}$ cavity beam chopper. According to standard usage in the field of electromagnetism, the symbol "TM" indicates a Transverse Magnetic field, i.e. an electromagnetic field that has no longitudinal magnetic component (so that B=0 along the z-axis), whereas the triplet of subscripts "110" denotes integer eigenvalues of a wave vector k needed to satisfy boundary conditions pertaining to Maxwell's equations in the cavity. A $TM_{110}$ mode is a dipole mode with a strong lateral magnetic field at radius r=0 (measured outward from the z axis) and zero electric field at r=0. Use of a $TM_{110}$ cavity to chop a continuous beam is advantageous in that it produces high-coherence pulses. Moreover, it can generally achieve a substantially higher repetition rate than a capacitive deflector—readily operating at the abovementioned 2.998 GHz s-band frequency. This creates the potential for a relatively large number of primary pulses per secondary excitation.

In a further embodiment of the invention:

The primary source comprises a series arrangement of an RF cavity beam chopper and an oscillatory electromagnetic beam deflector;

An operating frequency of said oscillatory electromagnetic beam deflector is matched to a frequency of the employed specimen excitations (from said secondary source).

Such an arrangement can be used to convert what would otherwise be a continuous flow of pulses (from the RF cavity) into a series of discrete pulse trains, whereby each pulse train is timed to coincide with a specimen excitation. The deflector may be located upstream or downstream of the cavity, according to choice/the specifics of a given situation.

As an alternative to the use of an oscillatory electromagnetic beam deflector/RF cavity as set forth above, one could instead use pulsed laser triggering for the primary source, e.g. as in the case of laser-induced photoelectric emission (of electrons or positive ions) from a target such as a metallic foil or disk, $LaB_6$ filament, Schottky filament, etc; however, such an approach can (in certain situations) be somewhat less advantageous in the current context, in that it typically produces a lower pulse rate (e.g. ~190 fs (femtosecond) pulses at a mutual separation of ~1 μs (microsecond)).

In another embodiment of the invention, a phase of the primary pulse train is adjusted between two successive excitations of said specimen. The pulses in the primary train can be regarding as representing short "sampling windows" of extended specimen behavior, with "blank" (i.e. un-sampled) regions between neighboring pulses. These blank regions can be "explored" by shifting the (phase of the) pulse train (by less than one period) between successive excitations; for example, if it is planned to subject a specimen to 10 excitations, then one could shift the primary pulse train phase by (for example) $2\pi/10$ between successive excitations. Note that the phase does not have to be shifted between each pair of consecutive excitations: it is, for example, possible to have a first group of excitations at a first primary phase, then a primary phase shift, and then a second group of excitations at a second primary phase. The skilled artisan will understand this point, and will be able to choose the timing, magnitude and size of any such phase shifts (if any) that he wishes to employ.

The present invention is particularly advantageous for primary source pulse durations ($d_p$)<1 ns (nanosecond) and primary source repetition rates ($r_p$)>50 MHz. It is even more useful for $d_p$<100 ps (picoseconds) and $r_p$>300 MHz, and it offers highly innovative possibilities for $d_p$~1 ps [or shorter] and $r_p$~1 GHz (e.g. 600 MHz) [or faster]. Typically, the repetition frequency of the secondary source will lie in the kHz-MHz range, though this should not be considered as limiting.

For completeness, it should be noted that a $TM_{110}$ mode as referred to above can, for example, be excited in a cavity with the aid of a Hertzian dipole loop antenna placed close to the wall of the cavity (distal from the z-axis). An antenna of this type can, for example, be achieved by:

Creating a small bore in a wall of the cavity;

Feeding the inner conductor of a coaxial cable through this bore to the interior of the cavity, in such a way that said inner conductor does not touch said (conducting) wall;

Creating a loop in said inner conductor proximal to said wall;

Orienting the loop appropriately (e.g. so that its plane is normal to the y-axis, to excite a magnetic field parallel to y);

Connecting said coaxial cable to an oscillating Radio Frequency (RF) excitation source (power supply/amplification stage).

The vibrational behavior of the cavity can be adjusted in various ways. For example, the frequency of said oscillating excitation source can be altered. Alternatively, a small conducting (e.g. metallic) or dielectric "plunger" (tuning element) can be partially inserted into the cavity, e.g. through a small bore opposite the above-mentioned antenna; the extent of insertion of such a plunger will then influence the resonant frequency of the cavity, because:

Insertion of a conducting plunger will locally decrease the effective radius of the cavity, with an attendant increase in resonant frequency;

Insertion of a dielectric plunger will increase the effective dielectric constant of the cavity, with an attendant decrease in resonant frequency.

Needless to say, when the cavity is excited on-resonance (i.e. the frequency of the oscillating excitation source is matched to the resonant frequency of the cavity), the resulting electromagnetic fields in the cavity will be at their largest. The skilled artisan will be familiar with such concepts, and will be able to implement and optimize them according to the details/requirements of a particular configuration; in particular, he will realize that other types and/or locations of antenna (or other means of excitation) can be employed, as well as other types and/or locations of tuning element/plunger. As regards the geometry of a resonant cavity used in the present invention, this may, for example, be a so-called "pillbox cavity" (which is essentially cylindrical in form), though other shapes are also possible. It should be noted that the efficiency of a $TM_{110}$ cavity can be improved by (partly) filling the cavity with a suitable dielectric material.

The skilled artisan will understand that the methodology/apparatus of the present invention can, in principle, be used to collect one or more of an image, a spectrum (such as an EELS spectrum) or a diffractogram from a specimen under investigation.

The invention will now be elucidated in more detail on the basis of an exemplary embodiment and the accompanying schematic drawing, in which:

FIG. 1 renders a longitudinal cross-sectional elevation of a particular type of CPM in which an embodiment of the current invention is implemented.

In the FIGURE, corresponding features may be denoted using corresponding reference symbols.

EMBODIMENT 1

FIG. 1 is a highly schematic depiction of an embodiment of a CPM M in which an embodiment of the current invention is implemented; in this case, the CPM is a (S)TEM, though, in the context of the current invention, it could just as validly be an ion-based or proton microscope, for example. In the FIGURE, within a vacuum enclosure 2, a continuous electron source 4 (such as a Schottky emitter, for example) produces a beam (B) of electrons that traverse an electron-optical illuminator 6, serving to direct/focus them onto a chosen part of a specimen S (which may, for example, be (locally) thinned/planarized). This illuminator 6 has an electron-optical axis B', and will generally comprise a variety of electrostatic/magnetic lenses, (scan) deflector(s) 8, correctors (such as stigmators), etc.; typically, it can also comprise a condenser system (in fact, the whole of item 6 is sometimes referred to as "a condenser system").

The specimen S is held on a specimen holder H. As here illustrated, part of this holder H (inside enclosure 2) is mounted in a cradle A' that can be positioned/moved in multiple degrees of freedom by a positioning device (stage) A; for example, the cradle A' may (inter alia) be displaceable in the X, Y and Z directions (see the depicted Cartesian coordinate system), and may be rotated about a longitudinal axis parallel to X. Such movement allows different parts of the specimen S to be irradiated/imaged/inspected by the electron beam traveling along axis B' (and/or allows scanning motion to be performed as an alternative to beam scanning [using deflector(s) 8], and/or allows selected parts of the specimen S to be machined by a (non-depicted) focused ion beam, for example).

The (focused) electron beam B traveling along axis B' will interact with the specimen S in such a manner as to cause various types of "stimulated" radiation to emanate from the specimen S, including (for example) secondary electrons, backscattered electrons, X-rays and optical radiation (cathodoluminescence). If desired, one or more of these radiation types can be detected with the aid of sensor 22, which might be a combined scintillator/photomultiplier or EDX (Energy-Dispersive X-Ray Spectroscopy) module, for instance; in such a case, an image/spectrum could be constructed using basically the same principle as in a SEM. However, of principal importance in a (S)TEM, one can instead/supplementally study electrons that traverse (pass through) the specimen S, emerge (emanate) from it and continue to propagate (substantially, though generally with some deflection/scattering) along axis B'. Such a transmitted electron flux enters an imaging system (combined objective/projection lens) 24, which will generally comprise a variety of electrostatic/magnetic lenses, deflectors, correctors (such as stigmators), etc. In normal (non-scanning) TEM mode, this imaging system 24 can focus the transmitted electron flux onto a fluorescent screen 26, which, if desired, can be retracted/withdrawn (as schematically indicated by arrows 26') so as to get it out of the way of axis B'. An image (or diffractogram) of (part of) the specimen S will be formed by imaging system 24 on screen 26, and this may be viewed through viewing port 28 located in a suitable part of a wall of enclosure 2. The retraction mechanism for screen 26 may, for example, be mechanical and/or electrical in nature, and is not depicted here.

As an alternative to viewing an image on screen 26, one can instead make use of the fact that the depth of focus of the electron flux emerging from imaging system 24 is generally quite large (e.g. of the order of 1 meter). Consequently, various types of sensing device/analysis apparatus can be used downstream of screen 26, such as:

TEM camera 30. At camera 30, the electron flux can form a static image (or diffractogram) that can be processed by controller 10 and displayed on a display device (not depicted), such as a flat panel display, for example. When not required, camera 30 can be retracted/withdrawn (as schematically indicated by arrows 30') so as to get it out of the way of axis B'.

STEM detector 32. An output from detector 32 can be recorded as a function of (X,Y) scanning position of the beam B on the specimen S, and an image can be constructed that is a "map" of output from detector 32 as a function of X,Y. Typically, detector 32 will have a much higher acquisition rate (e.g. $10^6$ points per second) than camera 30 (e.g. $10^2$ images per second). In conventional tools, detector 32 can comprise a single pixel with a diameter of e.g. 20 mm, as opposed to the matrix of pixels characteristically present in camera 30. Once again, when not required, detector 32 can be retracted/withdrawn (as schematically indicated by arrows 32') so as to get it out of the way of axis B' (although such retraction would not be a necessity in the case of a donut-shaped annular dark field detector 32, for example; in such a detector, a central hole would allow beam passage when the detector was not in use).

As an alternative to imaging using camera 30 or detector 32, one can also invoke High-Temporal-Resolution (HTR) detector 34 in accordance with the present invention, as explained below.

It should be noted that the order/location of items 30, 32 and 34 is not strict, and many possible variations are conceivable. The functionalities provided by items 30, 32, 34 are also not necessarily exhaustive; for example, the microscope M could also comprise an EELS module, for instance.

Note that the controller/computer processor 10 is connected to various illustrated components via control lines (buses) 10'. This controller 10 can provide a variety of functions, such as synchronizing actions, providing setpoints, processing signals, performing calculations, and displaying messages/information on a display device (not depicted). Needless to say, the (schematically depicted) controller 10 may be (partially) inside or outside the enclosure 2, and may have a unitary or composite structure, as desired. The skilled artisan will understand that the interior of the enclosure 2 does not have to be kept at a strict vacuum; for example, in a so-called "Environmental (S)TEM", a background atmosphere of a given gas is deliberately introduced/maintained within the enclosure 2. The skilled artisan will also understand that, in practice, it may be advantageous to confine the volume of enclosure 2 so that, where possible, it essentially hugs the axis B', taking the form of a small tube (e.g. of the order of 1 cm in diameter) through which the employed electron beam passes, but widening out to accommodate structures such as the source 4, specimen holder H, screen 26, camera 30, detector 32, HTR detector 34, etc.

In the context of the current invention, the microscope M comprises:

A $TM_{110}$ cavity 12, which is deployed as a beam chopper, serving to pulse the beam emerging from continuous/static source 4. Cavity 12 is connected to an electrical excitation source 16.

An electrostatic (e.g. capacitive) deflector 14, which is intended to operate at a lower oscillation frequency to that of cavity 12, and serves to convert a continuous stream of pulses from cavity 12 into a series of pulse trains. Deflector 14 is connected to an electrical excitation source 18. The composite structure formed by continuous source 4, cavity 12 and deflector 14 can be regarded as forming a primary source 4' in the context of the present invention. If desired, item 14 could alternatively be an RF cavity, configured to operate at a lower frequency than cavity 12. Item 14 could, if desired, be placed upstream of cavity 12 (before it) instead of downstream (after it; as depicted in the FIGURE).

A secondary source 20, which produces repetitive excitations 20' of the specimen S. In this particular case, the source 20 is a pulsed laser, and excitations 20' are laser beam pulses. The operating frequencies of secondary source 20 and deflector 14 are matched to one another, so that specimen S receives one of the abovementioned primary pulse trains per secondary excitation 20'.

Pulsed lasers 20 used for specimen excitation in this matter typically produce pulses at a frequency of ~75-80 MHz, with each pulse duration of the order of ~1 femtosecond.

Detector 34 is a Timepix detector comprising an integrated array of pixels, each with an individual readout circuit. The oscillation frequency of cavity 12 is chosen so as to match the minimum temporal resolution of detector 34.

Cavity 12 and deflector 14 are arranged on beam path B', and each is provided with an entrance and exit aperture (e.g., a pair of oppositely-located, small, axial holes [for a cavity] or slits [for a capacitive deflector]) to allow them to be traversed by beam B. When these cavities are not needed (e.g. because the CPM M is being used in "normal" mode rather than "time-resolved" mode), they can simply be switched off; alternatively/supplementally, one or more of them can mounted on a retraction mechanism that can be used to move them out of the path of beam B (and move them back into position when required).

The invention claimed is:

1. A method of investigating a specimen using charged particle microscopy, comprising:
    providing, by a primary source, a pulsed beam of charged particles to the specimen;
    while providing the pulsed beam of charged particles, exciting, by a secondary source, the specimen coincidentally with the pulsed beam of charged particles;
    detecting, by a detector, charged particles that traverse the specimen after each said excitation; and
    determining, by the detector, a time-of-arrival of individual charged particles that traverse the specimen, wherein the detector includes an integrated array of pixels, each with an individual readout circuit.

2. A method according to claim 1, wherein the pulsed beam of charged particles includes a plurality of pulses, and wherein the plurality of pulses are incident on the specimen while the specimen is being excited.

3. A method according to claim 2, wherein a phase of said pulse train is adjusted between two successive excitations of said specimen.

4. A method according to claim 1, wherein said primary source comprises an oscillatory electromagnetic beam deflector.

5. A method according to claim 4, wherein said deflector comprises a $TM_{110}$ RF cavity beam chopper.

6. A method according to claim 4, wherein:
    said primary source comprises a series arrangement of an RF cavity beam chopper and an oscillatory electromagnetic beam deflector; and
    an operating frequency of said oscillatory electromagnetic beam deflector is matched to a frequency of said excitations.

7. A method according to claim 1, wherein said secondary source is a laser.

8. A method according to claim 1, wherein a phase of said pulsed beam of charged particles is adjusted between two successive excitations of said specimen.

9. A method according to claim 1, wherein, for the primary source, values of a pulse duration $d_p$ and pulse repetition rate $r_p$ are selected from the group consisting of:
    $d_p < 1$ ns and $r_p > 50$ MHz;
    $d_p < 100$ ps and $r_p > 300$ MHz; and
    $d_p \leq 1$ ps and $r_p \geq 1$ GHz.

10. A charged particle microscope comprising:
    a primary source, for producing a pulsed beam of charged particles that propagate along a beam path;
    a specimen holder, for holding a specimen at an irradiation position in said beam path;
    a secondary source, for producing repetitive excitations of the specimen;
    a detector, for registering charged particles in said beam that traverse the specimen after each said excitation; and
    an electronic controller, for administering operational characteristics of the microscope,
    wherein:
    said controller is configured to operate said primary source so as to produce a train of multiple pulses per excitation by said secondary source; and
    said detector is configured to comprise an integrated array of pixels, each with an individual readout circuit, to register a time-of-arrival at the detector of individual particles in said train.

11. The charged particle microscope of claim 10, wherein the primary source comprises:
    a source of a continuous beam of charged particles along the beam path; and
    one or more deflectors to produce the pulsed beam of charged particles.

12. The charged particle microscope of claim 10, wherein the primary source comprises a series arrangement of an RF cavity beam chopper and an oscillatory electromagnetic beam deflector operating at a frequency matched to a frequency of said excitations.

13. A method of investigating a specimen, comprising:
    repetitively exciting the specimen using a secondary source;
    irradiating the specimen with multiple charged particle pulses after an excitation;
    registering, at a detector including an array of pixels, a time of arrival of individual charged particles that pass through the specimen after the excitation; and
    reading out the times of arrival of individual charged particles using individual pixels readout circuits.

14. The method of claim 13, wherein repetitively exciting the specimen using a secondary source comprises repetitively exciting the specimen using a laser.

15. The method of claim 13, wherein irradiating the specimen with multiple charged particle comprises:
    producing from a source a continuous beam of charged particles; and
    deflecting the continuous beam of charged particles to form the pulsed beam of charged particles that irradiate the specimen.

16. The method of claim 13, wherein registering, at a detector including an array of pixels, a time of arrival of individual charged particles comprises registering particles with a hybrid detector having a semiconductor sensor layer bonded to a processing electronics layer, and further having time-over-threshold and/or time-of arrival functionalities.

17. The method of claim 13, wherein irradiating the specimen with multiple charged particle pulses comprises producing a train of multiple pulses by passing a continuous beam of charged particles through a series arrangement of an RF cavity beam chopper and an oscillatory electromagnetic beam deflector.

18. The method of claim 17, wherein producing a train of multiple pulses by passing a continuous beam of charged particles through a series arrangement of an RF cavity beam chopper and an oscillatory electromagnetic beam deflector comprises producing a train of multiple pulses by passing a continuous beam of charged particles through a series arrangement of an RF cavity beam chopper and an oscillatory electromagnetic beam deflector operating at an operating frequency matched to a frequency of the repetitive excitations of the specimen using the secondary source.

\* \* \* \* \*